United States Patent [19]

Trimberger

[11] Patent Number: 5,650,946
[45] Date of Patent: Jul. 22, 1997

[54] LOGIC SIMULATOR WHICH CAN MAINTAIN, STORE AND USE HISTORICAL EVENT RECORDS

[75] Inventor: Stephen M. Trimberger, San Jose, Calif.

[73] Assignee: Xilinx, Inc., San Jose, Calif.

[21] Appl. No.: 369,249

[22] Filed: Jan. 6, 1995

[51] Int. Cl.⁶ ............................................. G06G 7/48
[52] U.S. Cl. ......................... 364/578; 364/488; 395/500
[58] Field of Search ............................ 364/488, 489, 364/490, 491, 578; 395/500

[56] References Cited

U.S. PATENT DOCUMENTS

| | | | |
|---|---|---|---|
| 4,814,963 | 3/1989 | Catlin | 364/200 |
| 4,821,220 | 4/1989 | Duisberg | 364/578 |
| 4,916,647 | 4/1990 | Catlin | 364/578 |
| 4,965,743 | 10/1990 | Malin et al. | 364/513 |
| 4,967,386 | 10/1990 | Maeda et al. | 364/578 |
| 5,410,673 | 4/1995 | Oguri | 395/500 |
| 5,446,870 | 8/1995 | Hinsberg et al. | 395/500 |
| 5,467,462 | 11/1995 | Fujii | 364/578 |
| 5,475,832 | 12/1995 | Shoji et al. | 395/500 |
| 5,481,484 | 1/1996 | Ogawa et al. | 364/578 |
| 5,517,658 | 5/1996 | Gluss et al. | 395/800 |

*Primary Examiner*—Kevin J. Teska
*Assistant Examiner*—Leigh Marie Garbowski
*Attorney, Agent, or Firm*—Adam H. Tachner, Esq.; Edel M. Young

[57] ABSTRACT

A system and method for event-driven simulation of a circuit is disclosed. The system includes a simulation history of events and node values at various times throughout the simulation of the circuit. The system allows the user to access the simulation history during the simulation, make changes to the state of the circuit at any time recorded within the simulation history, and resume the simulation of the circuit automatically corrected for any changes.

18 Claims, 6 Drawing Sheets

LOGIC SIMULATOR WHICH CAN MAINTAIN, STORE AND USE HISTORICAL EVENT RECORDS

FIELD OF THE INVENTION

This invention pertains to the field of computer-aided design, and more particularly to integrated circuit simulation.

BACKGROUND OF THE INVENTION

Verification tools such as simulators play a vital role in efficient integrated circuit design. A circuit designer may use a simulator to verify that a design actually performs a desired function before fabricating a physical representation of that design. With the increasing complexity and expense of designing integrated circuits comes an increasing need for design verification tools which accelerate and simplify the design process.

The event-driven simulator is such a tool. In an event-driven simulator, small procedures, or functions, model the behavior of circuit elements, or cells, such as simple logic gates or more sophisticated elements such as arithmetic logic units. These procedures set the values of variables to represent nodes, such as wires or connections, within the circuit. Each node carries a signal, a unit of information in the simulation. Simulation is accomplished by setting the values of signals on nodes at the appropriate times.

In an event-driven simulator, an event is scheduled for a future time in the simulation when the simulator determines that the value of a signal on a node is to change. The information comprising an event includes the node to be changed, the new value of the signal at the node and the time at which the change is to take place. Pending events for any particular time are sorted in a prioritized event queue. The event queue provides the key list of tasks for a simulation.

In a known method of event-driven simulation, a next event is taken from the event queue. The value of the node affected is then set and every function that takes the node as an input is then evaluated. The function evaluations generate more events which are then added to the event queue.

For example, an input to an AND gate changes at simulated time T=12 nanoseconds (ns). The AND gate is re-evaluated and its output should change 2 ns later, at T=14 ns. The simulator schedules an event for the node of the AND gate output, storing its new value and time T=14 ns. The output of the AND gate is not changed immediately, since other activity may occur at T=13 ns which will use the current (not yet changed) value of the AND gate output node.

The simulator takes events in sequence, perhaps evaluating more events at T=12 ns and T=13 ns until it reaches T=14 ns. It removes the event from its list of pending changes, makes the change to the AND gate output and evaluates all the destinations of that node (the node's fanout), possibly creating more events at future times. The event information is then discarded.

With events generated in this manner, each cycle of the simulator invokes only those functions that must be evaluated. Since very few of the functions are invoked for each event, the event-driven method has the advantage of avoiding scanning a list of functions by keeping with each node a list of the functions it drives. All functions common to simultaneous events are preferably evaluated simultaneously to avoid re-evaluating the same function when only one evaluation is needed. Since modern circuits can include over a million cells, this feature of event-driven simulators is especially significant due to the long processing time required to evaluate all cell functions. It is desirable to further limit the amount of function evaluation needed during the simulation process while generating accurate results.

To allow a user to control a simulation, event-driven simulators supply a user interface. In the user interface, the user is allowed to examine nodes, set node values and restart simulation.

If desired, a simulation can be scheduled to run for a specific amount of time with periodic interruption for the user interface. Similarly, the user interface can be invoked when certain node conditions are met or when a simulation is complete. A user interface may also be invoked when an unexpected system failure occurs.

PRIOR ART SIMULATION SYSTEM

It will be helpful to an understanding of the present invention to first describe a known simulation system and flow diagram.

In FIG. 1, two AND gates 10 and 20 are shown. The inputs to AND gate 10 are nodes 12 and 14, and the inputs to AND gate 20 are nodes 16 and 24. Output node 16 of gate 10 is one input of gate 20. The output of gate 20 is node 26. For purposes of discussion it is assumed that gate 10 has a delay of 20 time units (e.g., tenths of nanoseconds) and gate 20 a delay of 10 time units.

The algorithm set forth in flow diagram form in FIG. 2 can be used to simulate circuits such as the circuit of FIG. 1. Obviously, in practice, much more complicated circuits are simulated containing hundreds of thousands or even millions of gates.

In the prior art, before the simulation begins, the circuit which is to be simulated is first represented digitally as a collection of gates. In this representation, a fanout of each node is set forth. Each fanout describes all the destinations of a node. For instance, referring to FIG. 1, it would be noted that in the fanout record of node 16 that the output of gate 10 is connected to one input terminal of gate 20. If there were other gates connected to this node, they would be set forth as well as part of the node's fanout. Similarly, for nodes 24, 26, 12, and 14, other gates coupled to these nodes would be set forth in their respective fanout information.

A state array is used in the known simulator to store the current values of the circuit nodes throughout the simulation. Each time a node value changes, the state array is updated accordingly. If desired, state information may be stored with the other information that makes up a node, such as the list of gates in a node's fanout.

The circuit representation in the simulator also includes a full description of behavior characteristics of each of the logical components. For gate 10, the stored characteristics would indicate that gate 10 has a delay of 20 time units and that the output of the gate goes high when both inputs are high. Similarly, for gate 20 the entry for this gate would indicate that its output goes high when both its inputs are high and that the gate has a delay of 10 time units. Such description may also be made in the form of a truth table for each logical device.

The following example refers to simulated time in time units. A typical time unit for the circuit of FIG. 1 would be 0.1 nanoseconds (ns). We will assume the simulation is to run for 6 ns beginning at time 0 ns, so the target time for completing the simulation is 60 time units.

Typically, in a simulation, there are initial events, conditions or inputs to stimulate the system being analyzed. To begin, assume all nodes for the circuit of FIG. 1 are initially zero. Assume further that at time 1 the potential at node 14 goes high (N14=1@1), at time 10 the potential at node 12 goes high (N12=1@10), and at time 40 the potential at node 24 goes high (N24=1@40). Corresponding events for these changes are placed in the event queue. A timing diagram of the nodes in the present example is provided in FIG. 4.

Events in the known simulator are stored with the simulated time for which each event is scheduled. Events are inserted into the event queue in any order. Events are removed from the event queue in order of increasing time. Therefore, every time an event is processed, it is the next most recent event. FIG. 3 provides a clear representation of an event queue implementation referred to as a time wheel. Each slot in the time wheel contains a list of all events at one time step in the simulation. The current time, t, progresses through all time slots.

At step 56, the simulation begins. At step 60 three pending events are found in the event queue, so the simulation continues. If no events had been found, a user interface would be entered at step 80 in FIG. 5 to allow the user to further define the circuit and any input signals to the circuit. The system checks at step 58 to ensure the time of the next event is within the range desired by the user. If not, a user interface is again triggered.

The system then retrieves a next event at step 62 (N14=1@1). Simulated time is then set to t=1 at step 66 for the time of the first event.

At t=1, node 14 is to switch from low to high voltage. The event was retrieved at step 62 and is executed at step 68. Because node 14 affects only gate 10, no other fanout nodes are affected. Because node 12 remains in a low state and output 16 of gate 10 will remain low, no new events will be calculated or scheduled at step 70.

Returning again to steps 56, 60, 58, and 62, the event N12=1@10 is found and taken from the event queue. The potential at node 12 goes high after execution of step 68. A first new event is scheduled at step 70 in response to the new voltage at node 12. The simulator schedules an event for time t=30 (N16=1@30). Thus, after the propagation delay for gate 10 has passed, the potential at AND output node 16 will switch from low to high.

The next retrieved event takes place at time t=30. At time t=30, the potential on node 16 rises via step 68. The node value is updated to indicate that node 16 is now high and the list of nodes and cells connected to this node is made which in the present example is just gate 20. At step 70 no new events are calculated because no change occurs at gate 20. The system returns to step 56.

The next event is to be executed at time t=40. After the current time is updated, the potential at node 24 rises. At step 70, the system calculates that the output of gate 20 does indeed change and a new event is placed in the event queue to indicate that at time 50 (because of the delay of 10 time units within gate 20) the output 26 of gate 20 rises in potential (N26=1@50). There is now another jump back to steps 56, 60 and 58 to ensure the simulation is still within the desired simulation run time.

The final event on the event queue indicates the output 26 of gate 20 rises in potential. Since there are no fanouts and no affected nodes or cells connected to node 26, the system again jumps back to step 56. Since there are no more events in the event queue, step 60 causes the simulation to return to the user interface 80.

In practice, the steps outlined above and shown in FIG. 2 occur quite rapidly. Nonetheless, for a very large circuit, a considerable amount of time is required for simulation. It is therefore desirable to minimize the amount of simulating, that is, actual cell evaluation and event derivation, which must be performed during the design process.

When a user is using a simulation to debug a design, he or she may find a node that takes on an incorrect value. To find the cause of the error, the user may need to examine node values from times before the time at which the error was first evident. Further, the user may need to re-run the simulation with some node values changed in order to verify the correctness of the circuit. The user may also want to mark nodes in which he or she has a particular interest, instructing the simulator to print or display any changes to a marked node during the simulation. Similarly, the user may wish make changes to a circuit structure to correct the circuit during the simulation.

One way to provide the user with these options is through a simulator which allows the user to step through a simulation record to find the source of design flaws. However, because the prior art system overwrites old node values each time an event is executed, the prior art system does not allow the user to access, mark or change the simulated design at any time earlier than the current simulated time during a simulation break.

Although methods and tools for simulating integrated digital circuits in a forward fashion are commonly known, presently available simulation tools do not allow the user to step through a simulation record to assist the user in finding and remedying design flaws. Such a tool would increase design speed by reducing the need for cell re-evaluation and by reducing the need to restart and step forward through a simulation each time a flaw's source is sought or a node value is changed.

SUMMARY OF THE INVENTION

The present invention is an improvement on existing event-driven simulation systems. Instead of discarding or merely overwriting a node signal value, the preferred embodiment of the present invention creates a simulation history stack storing the affected node, the old signal value at that node, the time the event took place, and the time the event was placed in the event queue. The depth of the history stack can be selected according to available resources considering the complexity of the simulated circuit and the span of time which may need to be reviewed. To step through the simulation history backward, the user can access the stack of completed events. The history stack contains information describing changes to all nodes during the simulation.

In a preferred embodiment, the user may step through the simulation record either backward or forward without re-evaluating gate values. When the user finds a questionable reading or a reading of particular interest, the user may implement any desired changes. The user may then restart the simulation or may step to a prior or later point in simulated time and begin the simulation of the improved circuit at that point. To allow the user these options, the system will reset the event queue to include only the appropriate events which are pending at the time simulation is resumed.

Accordingly, it is an object of the present invention to provide an event-driven system for simulating a circuit which maintains a user-accessible simulation history.

Another object of the present invention is to provide an event-driven system for simulating a circuit which allows for modification of node values within the circuit during user analysis of a simulation history followed by resumption of forward, updated circuit simulation.

DETAILED DESCRIPTION OF THE INVENTION

A system and method for circuit simulation is described which maintains a user-accessible simulation history. Access to the simulation history allows the user to review the simulation without re-evaluating gate values or generating new events, thereby saving processing time. The preferred embodiment of the system creates a record in stack form of events performed on nodes during a simulation.

Figure 5:
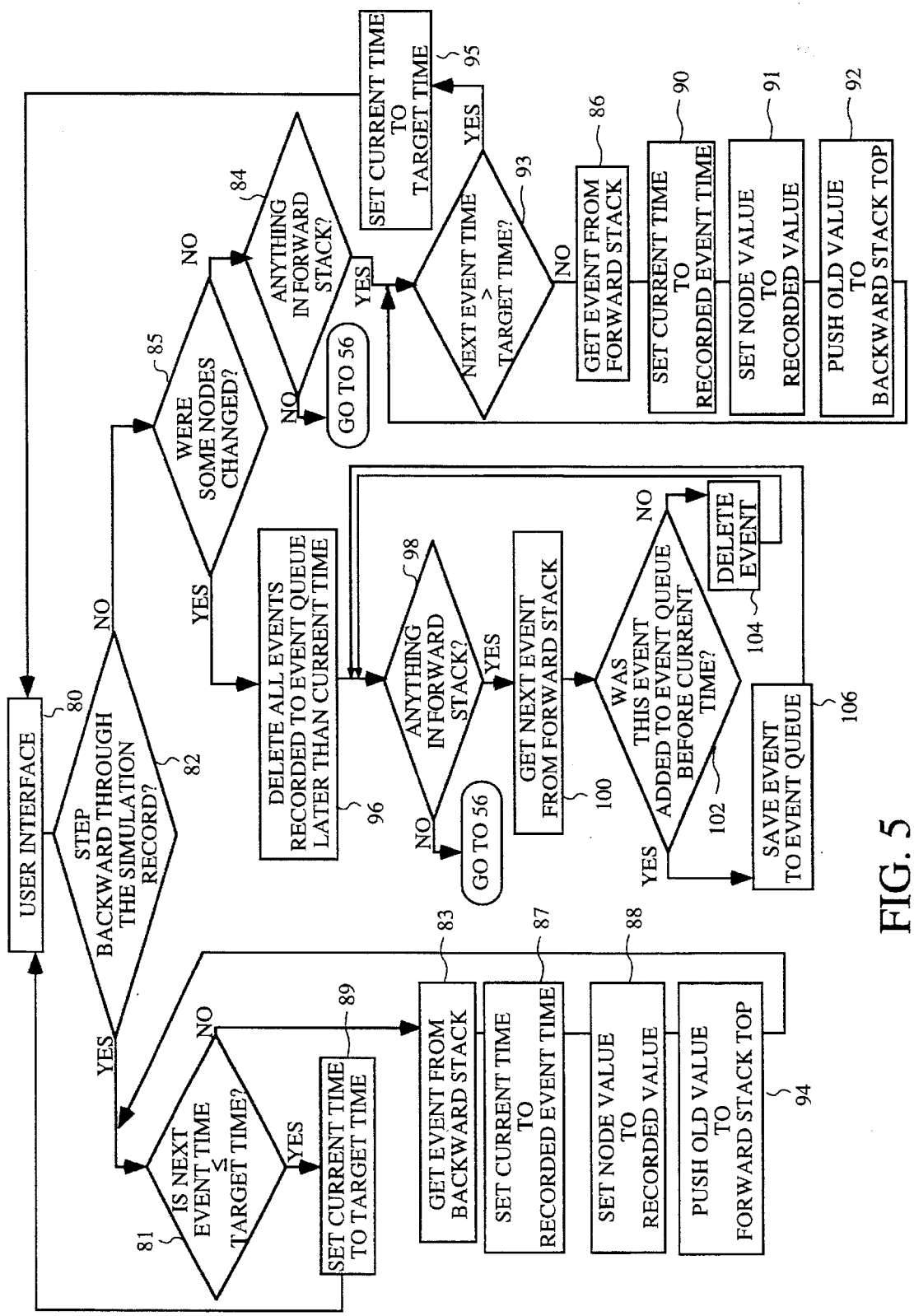
FIG. 5 is a flow diagram used to describe the formation of a user accessible simulation history and the steps for resumption of circuit simulation by the present invention.
Figure 6:
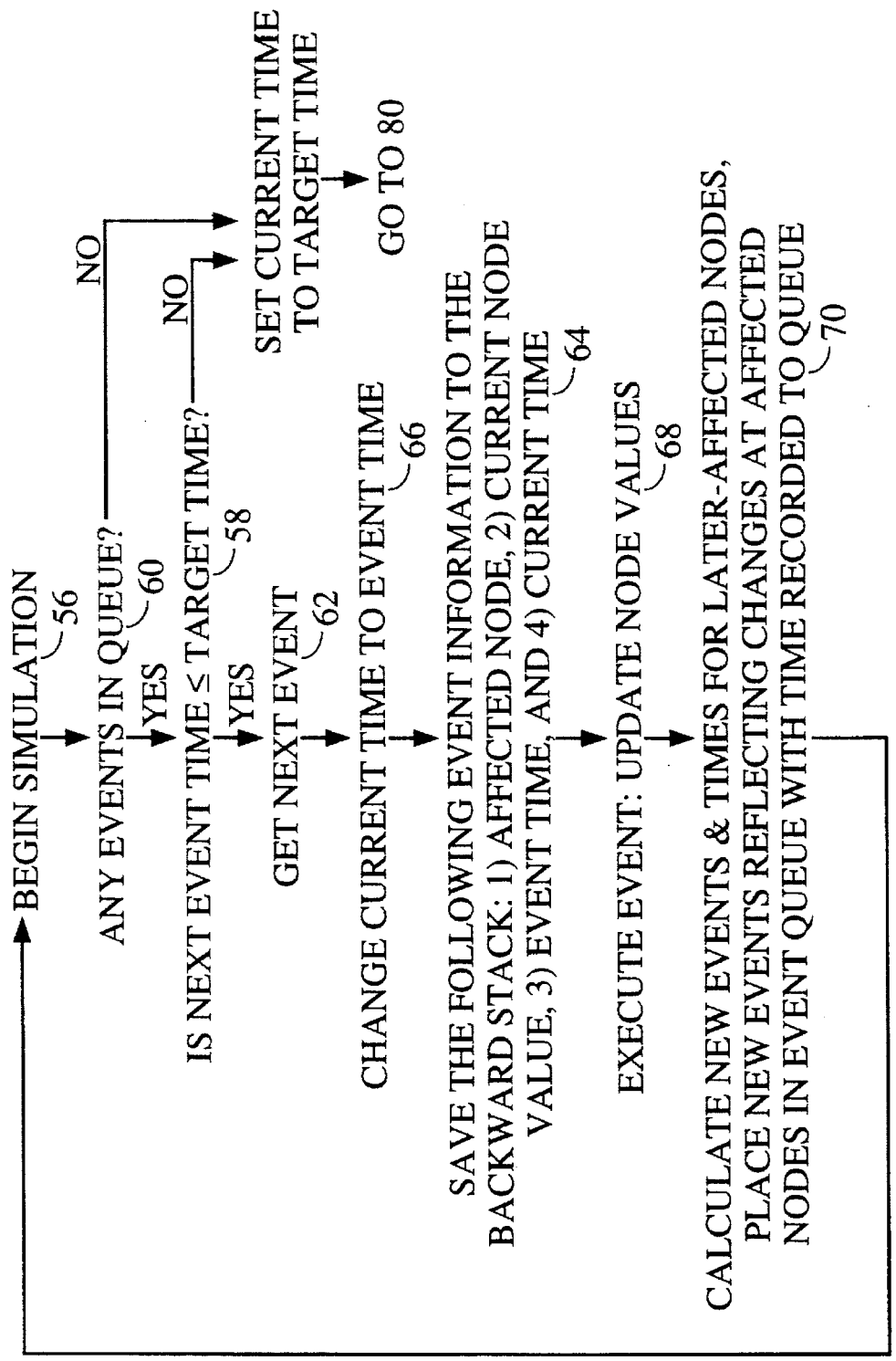
FIG. 6 is a flow diagram used to describe the improved, event-driven simulator of the present invention.

The system includes an improved simulator implementing the improved event-driven simulation method shown in FIGS. 5 and 6. The method implemented in the present invention includes a memory access and storage step 64 for storing events and node values. Because a record of simulation results is created, the user may step through the simulation results backward or forward as well as run the simulation forward. The inventive system includes a memory device such as random access memory (RAM) for fast access, or a magnetic or optical storage device such as a common hard drive to allow for high volume storage. Numerous other storage media known to the skilled artisan also may be used. The preferred embodiment of the inventive simulator provides a memory stack (the backward stack 110 in FIG. 7) for user access to the simulation history. The backward stack 110 of the preferred embodiment employs a last-in-first-out format. However, other storage structures known to those skilled in the art may be used.

As per the flow diagram of FIG. 5, the user begins the simulation process at step 80 by defining the circuit to be simulated and a finite time (ending at a target time) for the simulation to run. This description will first focus on forward simulation and the creation of the simulation history and will later return to structure, function and access to the inventive simulation record.

Figure 1:
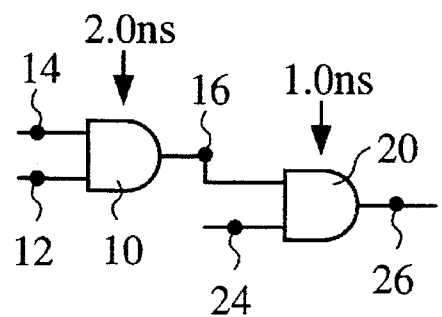
FIG. 1 is a schematic used to explain a simulation system.
Figure 3:
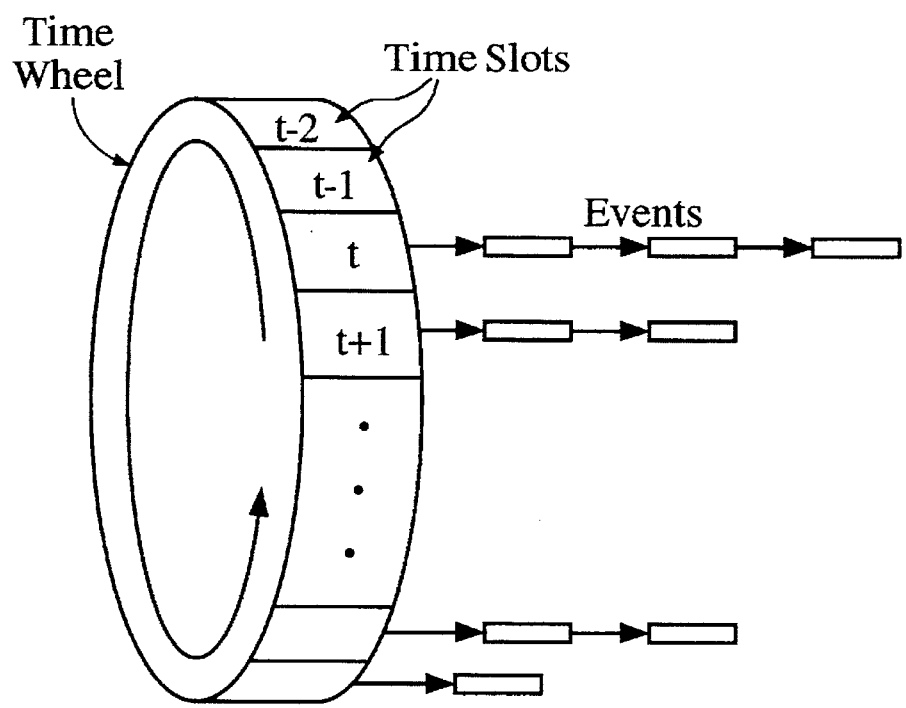
FIG. 3 is a representation of a time wheel memory configuration used in the present invention.
Figure 2:
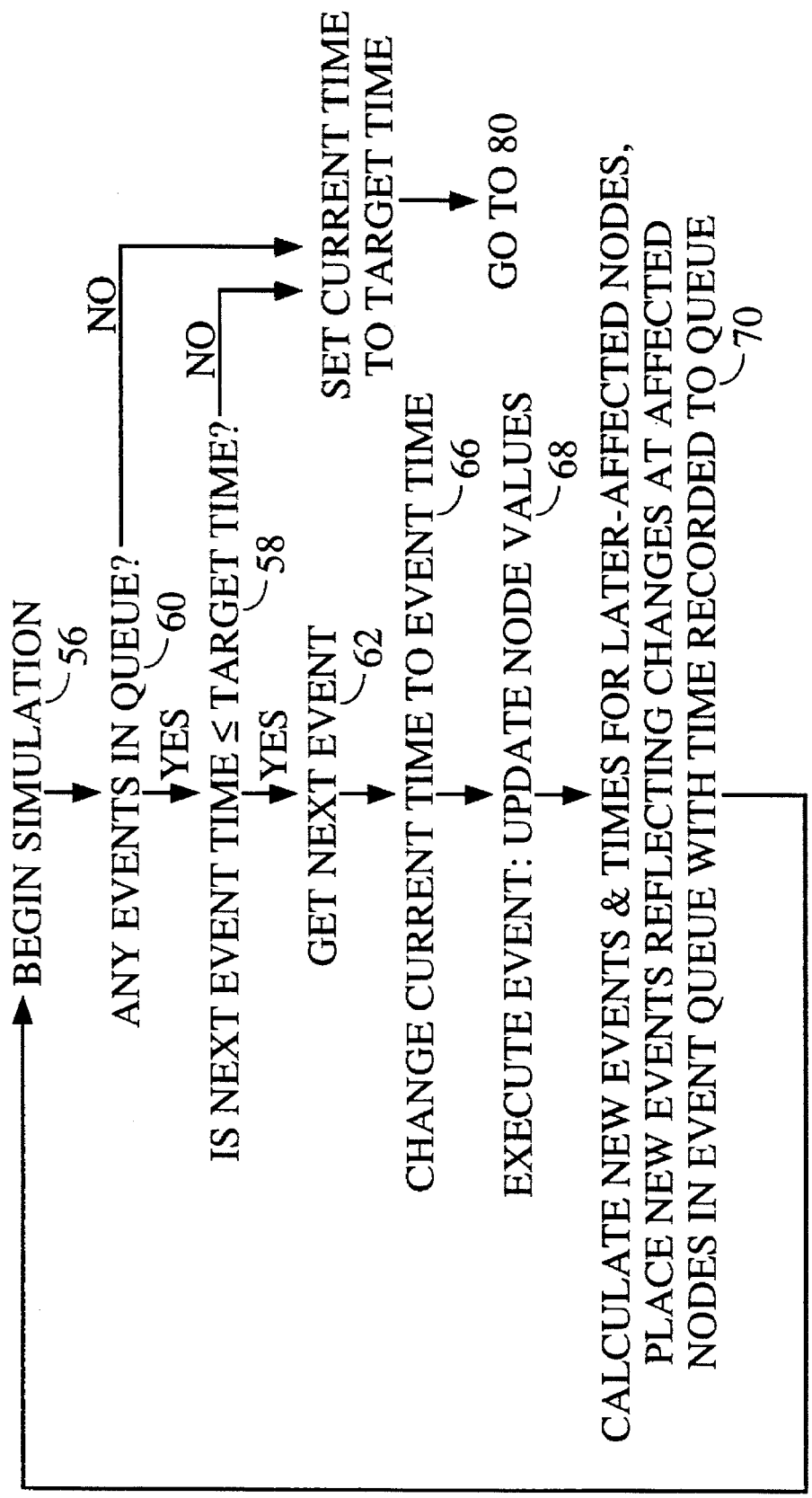
FIG. 2 is a flow diagram used to describe a prior art, event-driven simulator.
Figure 4:
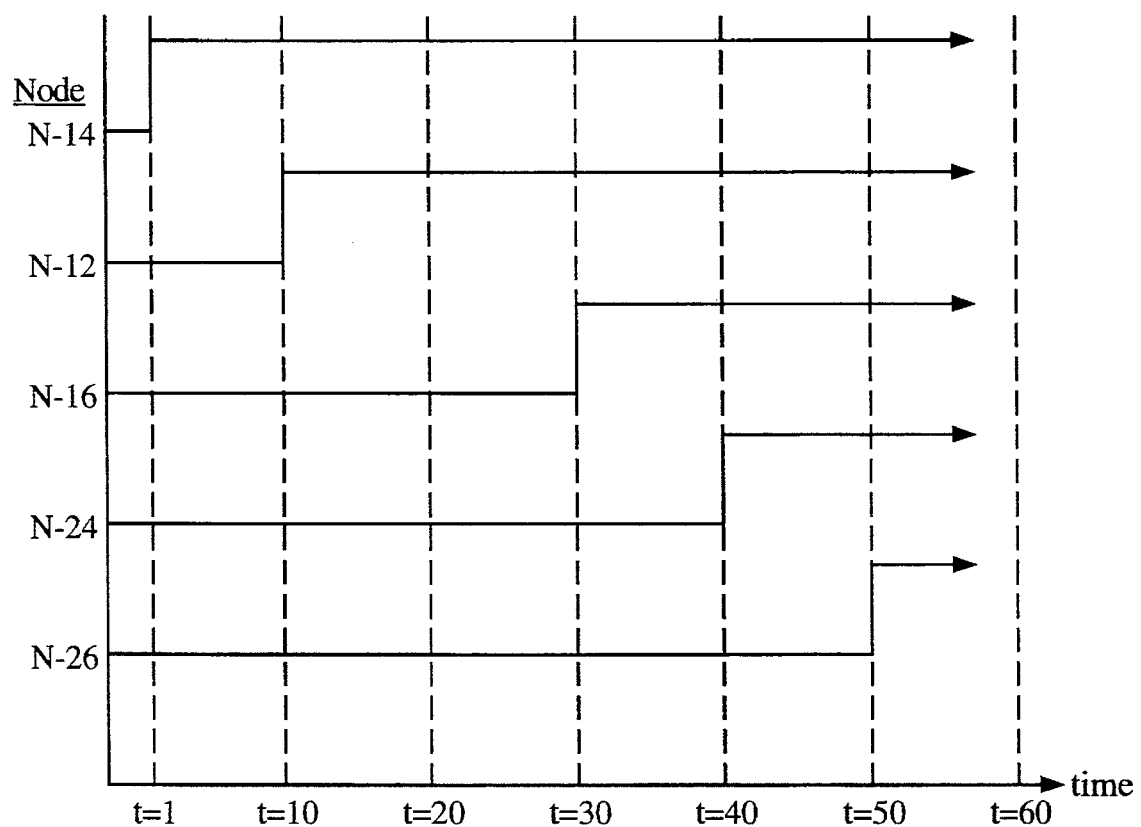
FIG. 4 is a timing diagram of an example of operation of an event-driven simulator.

Referring again to the circuit of FIG. 1, forward simulation proceeds as before with a single change. In step 64 of FIG. 6, old values of nodes and the times at which the nodes change are saved. In response to retrieving an event, the inventive simulator accesses a memory device (not shown) and begins to fill a simulation history referred to herein as the backward stack 110. The first entry into the backward stack 110 contains the following four pieces of information: the affected node (node 14); the value at that node before the event (low); the time of the event (at t=1); and, finally, the queue-placement time (not shown).

In another embodiment of the invention, the last piece of information (queue-placement time) can be excluded if gate delay values are accessible by the simulator. As understood by a skilled artisan, queue-placement time can then be calculated by subtracting the gate delay time from the time the event is to take place.

There will be one value saved for each event evaluated in a simulation. Thus, at time t=1, when event N14=1@1 is evaluated, the record N14=0@1 is saved. Before executing each event, at step 64 the critical event and node information is recorded to the top of the backward stack. In this manner, events N12=0@10, N16=0@30, N24=0@40 and N26=0@50 are saved. Saved events are stored in a stack form, with the most recent event (latest time) on top.

After time t=50 there are no more events in the queue. Run time ends at time t=60 and a user interface at step 80 of FIG. 5 is triggered at step 58. After 60 time units, the backward stack will contain in the following order:

N26=0@50
N24=0@40
N16=0@30
N12=0@10
N14=0@1

It is important to note that the inventive system comprises the combination of the memory access step 64 with the physical embodiment of the backward stack in the form of a storage means known to an artisan skilled in computer simulation techniques. Step 64 is not merely a mental step but represents a means and method to access a tangible storage medium.

Figure 7:
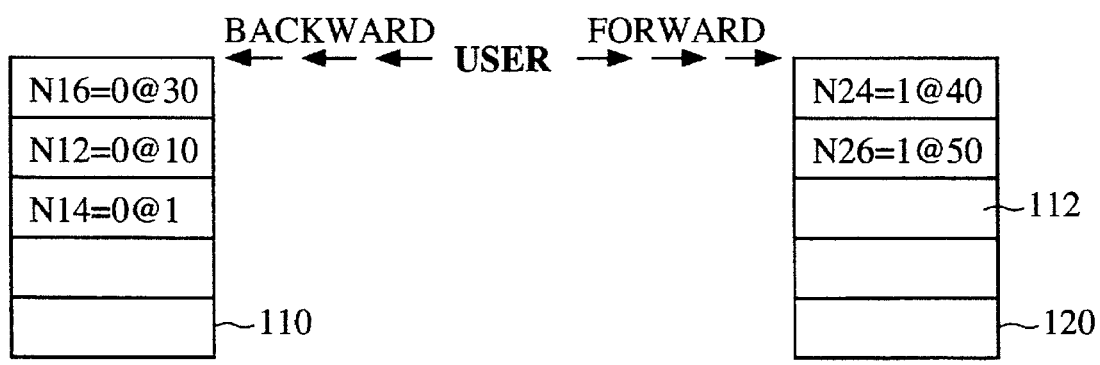
FIG. 7 is a representation of the stack structure used in the present invention.

Now that the simulation is complete (either the target time has been reached or no events remain in the event queue), a user interface 80 is invoked at step 60. The user may desire to step back through the simulation history in the backward stack, at step 82, to see what events have occurred and what effect these events have had on nodes of particular interest to the user. For example, the user can run the simulation backward a total time of 2.5 ns, or 25 time units. At steps 83, 87 and 88, the top of the backward stack indicates that node 26 was zero at time t=50. The newer value of node 26 (high) at time t=50 (N26=1@50) is saved on the forward stack 120 at step 94. Continuing to step backward, the simulator sets node 24 back to zero at time 40, saving the event N24=1@40 on the forward stack 120. At time t=35, the backward simulation ends at step 81 because the target time has been reached. The condition of the two stacks at time t=35, including the status of entries 112, is shown in FIG. 7.

If desired, the user can now proceed forward 10 time units. At step 84 we see two event entries 112 in the forward stack 120. At step 93 the simulator checks the next event time to ensure it is within the desired 10 forward time unit range. The simulator retrieves the first (earliest) event at step 86, sets the current time to t=40 at step 90 and sets node 24 to logic high at step 91. After the old value of node 24 is pushed as an event N24=0@40 to the backward stack at step 92, the simulation stops at time 45 after step 95.

There is no need to reevaluate any of the nodes while stepping through the simulation. The pre-event values at those nodes have been saved along with the event information. The results of each event have been stored in the next-in-time entry on the stack. Thus, the speed of stepping through the stack is limited only by the computer processor's memory access speed.

Response to Node Changes by the User

The user may opt to change a node value at step 80. Such a change would potentially change all nodes in the future.

However, the event queue contains events scheduled for future times, such as the event scheduled for t=50 (N26= 1@50) discussed above, which do not accurately reflect the new circuit status.

To restart the simulation, the user has a number of options. With the prior art simulation system, the user could return to the beginning of the simulation after making a node change, initialize the circuit, and wait for the system to reach the new addition. But because the preferred embodiment of the inventive simulator includes a complete record of the events performed and the times at which the events were placed into the event queue, the simulator can reconfigure the event queue to accurately reflect the new node values.

Referring again to the flow diagram of FIG. 5, if the user chooses to make a node change at step 80, and wishes to return to forward simulation, step 85 causes steps 96 through 106 to properly reset the event queue to allow for accurate resumption of circuit simulation after the change is made. For example, if the user entered the backward stack at t=60 and then stepped back to t=35, as above, then changed some node values, the event queue must be reset to include only those events pending in the event queue at time t=35.

The inventive simulation history of the present invention makes this process fairly simple. At step 96, events which were placed into the event queue after t=35 are deleted. All of these events are based on potentially obsolete node values. Next, at steps 98 and 100, the system searches events stored in the forward stack to seek out those events that were pending at t=35 to add to the event queue. Step 106 adds these pending events to the revised event queue. Similarly, steps 102 and 104 ensure that events from the forward stack which are not yet pending at the time of the design change will be deleted from the forward stack. The user can then implement a change to the circuit, confident that the change will be included in calculations of future events and the effects of pending events on newly altered or added circuit nodes. If it is not desired that a user be able to resume forward simulation after stepping backward and changing node values, then the time at which an event was added to the event queue is not necessary. When, at step 98, the forward stack is empty, the simulation system returns the user to step 56.

If, as in an alternative embodiment, all delays can be derived from known gate delay information, the resumption of forward simulation can be facilitated by calculating the time the event was added to the event queue from the event time and gate characteristic information.

In this manner, the user can avoid having to step back through the forward stack to the point of entry before resuming simulation, thereby saving time in the design process and benefitting from a more responsive simulation system.

If desired, the inventive simulation system can include a plurality of backward and forward stacks, thereby allowing the user to maintain complete simulation histories for each implemented node value modification. The basic and inventive nature of the preferred embodiment remains intact in this expanded system.

Thus, a circuit simulation system has been described which implements an improved event-driven method which allows the user to step through a simulation record, thereby easing the circuit design process. The simulation system also provides an event-driven system for simulating a circuit which allows for manual modification of the node values during user analysis of simulation results, followed by immediate and corrected resumption of circuit simulation. It will be understood by a skilled artisan that the inventive simulation system will work with the digital circuits described, as well as more complex simulations which include, for example, signal strength and other more detailed information.

The following computer program listing provides one technique for implementing the preferred embodiment of the present invention. While the program listing and the above discussion have particularly shown and described the invention with reference to the preferred embodiment thereof, it will be understood by those skilled in the art that changes in form and details may be made therein without departing from the spirit and scope of the invention.

M-2391                                                                                      PATENT

```
/* simrun.c -- running the simulator */ include <stdio.h>
include "general.h"
#include "simdb.h"
#include "simlib.h";
#include "simext.h"
#include "simrun.h"

int ctime;
int active_events = 0;

/* -------------------------------- */
free_event(e)
Event *e;
{
  e->next = freeEvents;
  freeEvents = e;
}

Event *new_event()
{
  Event *e;
  if(freeEvents==NULL) {
    e = New(Event);
  } else {
    e = freeEvents;
    freeEvents = freeEvents->next;
  }
  return(e);
}

/* -------------------------------- */ init_event_queue()
{
  int i;
  for(i=0; i<EVENT_QUEUE_SIZE; i++) timewheel[i] = NULL;
  freeEvents = NULL;
  backward_list=NULL;
  forward_list=NULL;
} clear_event_queue()
{
  Event *e, *e2;
  int i;
  for(i=0; i<EVENT_QUEUE_SIZE; i++) {
    e = timewheel[i];
    while(e != NULL) {
      e2 = e->next;
      if(e->time_in>now) free_event(e);
      e = e2;
    }
    timewheel[i] = NULL;
```

16

M-2391                                                                PATENT

```
  }
  active_events = 0;
}
/* ---------------------------------- */
clear_late_events(now)
   int now;
{
  Event *e, *e2, *last;
  int i;
  for(i=0; i<EVENT_QUEUE_SIZE; i++) {
    last = e = timewheel[i];
    while(e != NULL) {
      e2 = e->next;
      if(e->time_in>now) {
        if(last==timewheel[i]) last=timewheel[i]=e2;
        else last->next=e2;
        free_event(e);
        active_events--;
      }
      last = e = e2;
    }
  }
} add_this_event(e)
   Event *e;
{
  int twhen = e->time % EVENT_QUEUE_SIZE;

e->next = timewheel[twhen];
  timewheel[twhen] = e;
  active_events++;       /* event added to queue */
  e->node->event = e;    /* for checking duplicate sets and intrinsics */
} clear_forward_changes(now)
   int now;
{
  Event *e;
  /* remove events that were added after NOW */
  clear_late_events(now);       /* from the event queue */
  while(forward_list !=NULL) {  /* from forward_list */
    e = stack_pop(&forward_list);
    if(e->time_in<now) add_this_event(e);   /* put into EQ, for normal operation */
                      else free_event(e);
  }
}

/* ---------------------------------- */ schedule_run(runtime)
int runtime;
{
```

M-2391 PATENT

```
  int maxtime;

if(runtime<0) {
    backward_from_list(runtime);
    return;
  }
  maxtime = now+runtime;
  forward_from_list(maxtime);
  for(; now<=maxtime; now++) {
    ctime = now % EVENT_QUEUE_SIZE;
    if(timewheel[ctime] == NULL) continue;
    if(DEBUG) dump_event_queue();
    process_event_queue(now);
  }
  now--;    /* back out the last increment */
} forward_from_list(maxtime)
  int maxtime;
{
  Event *e;
  char oldvalue;

while (forward_list!=NULL && forward_list->time<=maxtime) {
    /* we ran the simulation backward
       now we're going forward again */
    e = stack_pop(&forward_list);
    now = e->time;
    oldvalue = e->node->val;
    set_node(e->node,e->newval);
    e->newval = oldvalue;
    stack_push(&backward_list,e);
  }
} backward_from_list(runtime)
  int runtime;
{
  Event *e;
  char oldvalue;
  int endtime=now+runtime;

while (backward_list!=NULL && backward_list->time>endtime) {
    /* run the simulation backward */
    e = stack_pop(&backward_list);
    now = e->time;
    oldvalue = e->node->val;
    set_node(e->node,e->newval);
    e->newval = oldvalue;
    stack_push(&forward_list,e);
  }
  now=endtime;
}
```

M-2391                                                                              PATENT

```
process_event_queue(now)
  int now;
{
  Event *e, *e2, *prev=NULL;
  char oldvalue;

e = timewheel[ctime];

while(e != NULL && active_events>0) {
    e2 = e->next;
    if(e->time == now) {
      if(prev==NULL) timewheel[ctime] = e2;
      else prev->next=e2;
      e->node->event = NULL;   /* it should have been==node, of course */
      active_events--;     /* event removed from queue */
      oldvalue = e->node->val;
      set_node_value(e->node, e->newval);
      if (reversible_simulation) {
        e->newval = oldvalue;
        stack_push(&backward_list,e);
      } else {
        free_event(e);
      }
    } else {
      prev = e;
    }
    e = e2;
  }
} set_node(n,val)
  Node *n;
  int val;
{
  Ingate *l;
  n->val = val;
  if(bittest(n->flags,NODE_WATCH))
    printf("Time %d.  %s -> %d\n", now, n->name,n->val);
} set_node_value(n,val)
  Node *n;
  int val;
{
  Ingate *l;
  set_node(n,val);

l = n->start;
  while(l != NULL) {
    evaluate_instance(l->instance,n);
    l = l->next;
  }
} evaluate_instance(i,changedNode)
```

19

M-2391                                                                                                                          PATENT

```
   Instance *i;
   Node *changedNode;
{
   int out;
   Ingate *e2;
   int deltat;
   int ii;
   Event *e;
   Node *n;
   int index;
   Cell *p;

p = i->cell;

switch (p->type) {
     case ('C'):
       index = 0;
       for(ii=0;ii<i->cell->ninputs; ii++) {
         index = index*NVALS_SIM + (i->inputs[ii])->val;
       }
       out = ((PrimContents *) i->cell->contents)->table[index];

if(DEBUG) printf("DEBUG: set %s to %d check\n", i->outputs[0]->name,
out);

if (out != i->outputs[0]->val) {
         /* schedule event only if value changed */
         deltat = ((PrimContents *) i->cell->contents)->delay;
         if(DEBUG) printf("DEBUG: set %s to %d at %d\n",
           i->outputs[0]->name, out, now+deltat);
         add_event(out, now, deltat, i->outputs[0]);
       }
       break;
     case ('B'):  /* built-in */
       switch (((PrimContents *) p->contents)->id) {
         case (5): /* dff */
           /* only active when clock goes high (2nd input) */
           if(!(changedNode==i->inputs[1] && changedNode->val==1)) break;
           out = (i->inputs[0])->val;

if(DEBUG) printf("DEBUG: set %s to %d check\n", i->outputs[0]->na
me, out);

if (out != i->outputs[0]->val) {
             /* schedule event only if value changed */
             deltat = ((PrimContents *) i->cell->contents)->delay;
             if(DEBUG) printf("DEBUG: set %s to %d at %d\n",
               i->outputs[0]->name, out, now+deltat);
             add_event(out, now, deltat, i->outputs[0]);
           }
           break;
       }
       break;
     default:
       printf("ERROR.  Unable to evaluate instance %s of cell %s.\n",i->name
```

M-2391                                                                                                    PATENT

```
,p->name);
      break;
   }
} add_event(val, now, deltat, node)
int val, now, deltat;
Node *node;
{
  Event *e,*ne;
  int twhen;

int when = now+deltat;
  e = node->event;
  if(e != NULL) {
    if(e->time==when) {
      /* same node and time -- don't need to move it in the queue => change
 val */
      e->newval = val;
      e->time_in = now;
      return;
    } else {
      remove_event(e);
    }
  } twhen = when % EVENT_QUEUE_SIZE;

e = new_event();
  e->node = node;
  e->newval = val;
  e->time = when;
  e->time_in = now;
  e->next = timewheel[twhen];
  timewheel[twhen] = e;
  active_events++;    /* event added to queue */
  node->event = e;    /* for checking duplicate sets and intrinsics */
}

/* remove it the hard way - singly linked list */
remove_event(re)
Event *re;
{
  Event *e,*prev=NULL;
  int twhen;
  twhen = re->time % EVENT_QUEUE_SIZE;

if(DEBUG) {
    printf("Removing event: ");
    print_event(re);
  }
  e = timewheel[twhen];
  while (e != NULL) {
    if(e==re) {
      if(prev==NULL) timewheel[twhen] = e->next;
```

21

M-2391                                                                PATENT

```
        else prev->next = e->next;
        break;
      }
      prev = e;
      e = e->next;
    } re->node->event = NULL;
    active_events--;    /* event added to queue */
    free_event(re);
} print_event(e)
Event *e;
{
    fprintf(log,"%dns %s(%d) -> %d (set @%d)\n",
      e->time, e->node->name, e->node->val, e->newval, e->time_in);
} dump_event_queue()
{
    int i,val;
    Event *e;
    fprintf(log, "\n");
    fprintf(log, "now=%d.  ctime = %d\n",now, ctime);
    for(i=0; i<EVENT_QUEUE_SIZE; i++) {
      if(timewheel[i]==NULL) continue;
      e = timewheel[i];
      fprintf(log, "Timewheel = %d\n",i);
      while(e != NULL) {
        print_event(e);
        e = e->next;
      }
    }
    if(forward_list!=NULL) {
      fprintf(log, "Forward List:\n");
      for(e=forward_list; e!=NULL; e = e->next) print_event(e);
    }
    if(backward_list!=NULL) {
      fprintf(log, "Backward List:\n");
      for(e=backward_list; e!=NULL; e = e->next) print_event(e);
    }
}

/* -------------------------------- */
stack_push(stack,e)
  Event **stack,*e;
{
  e->next = *stack;
  *stack = e;
}

Event *stack_pop(stack)
  Event **stack;
{
```

M-2391                                                                                           PATENT

```
    Event *e;
    if(*stack==NULL) return(NULL);
    e = *stack;
    *stack = (*stack)->next;
    return(e);
}
```

What is claimed is:

1. A method of activating and recording an event-driven simulation of the operation of a circuit, wherein the circuit is represented by a plurality of components connected by a plurality of nodes, each one of said nodes representative of an electrical connection in the circuit, each one of said nodes also having a corresponding node signal value representative of a signal at that node at a given point in time, said method comprising the steps of:
 (a) storing a plurality of events in an event queue, where each of said events comprises information about a selected node, information about each component connected to said selected node, and information about a scheduled time for said event to occur;
 (b) retrieving from said event queue a first event;
 (c) placing an event record of said first event in an event record storage, where each of said event records comprises an event time, the node associated with the event, and the node signal value of said associated node at a time before said event time;
 (d) executing said first event;
 (e) updating a node signal value storage to reflect execution of said first event;
 (f) scheduling a new event; and
 (g) recording said new event in the event queue.

2. The method of claim 1 wherein step (a) comprises placing in the event queue with each of said plurality of events the time each of said events was recorded to the event queue.

3. The method of claim 2, further comprising the steps of:
 suspending simulation of the circuit;
 accessing the information in said event record storage;
 modifying a signal value in the circuit;
 modifying said event queue; and
 reactivating simulation of the circuit.

4. The method of claim 1 further comprising storing said event information in a first memory stack.

5. The method of claim 4 wherein said first memory stack stores information for events occurring before a current time, and further comprising storing said event information for events occurring after a current time in a second memory stack.

6. The method of claim 1 further comprising the steps of:
 storing said event information for events occurring before a current time in a plurality of backward memory stacks; and
 storing said event information for events occurring after a current time in a plurality of forward memory stacks.

7. The method of claim 1, further comprising the steps of:
 suspending simulation of the circuit;
 accessing the information in said event record storage; and
 reactivating simulation of the circuit.

8. A method of activating and recording an event-driven simulation of the operation of a circuit, wherein the circuit is represented by a plurality of components connected by a plurality of nodes, each one of said nodes representative of an electrical connection in the circuit, each one of said nodes also having a corresponding node signal value representative of a signal in the circuit at that node at a given point in time, said method comprising the steps of:
 (a) retrieving an event from an event queue;
 (b) recording in a simulation record an event time, a node, and a signal value at said node corresponding to said event, said recording step occurring before said event time;
 (c) updating a node value storage;
 (d) scheduling a new event;
 (e) recording said new event in the event queue.

9. The method of claim 8, further comprising the steps of:
 suspending simulation of the circuit;
 accessing the information in said simulation record; and
 reactivating simulation of the circuit.

10. A system for activating and recording an event-driven simulation of the operation of a circuit, wherein the circuit is represented by a plurality of components connected by a plurality of nodes, each one of said nodes representative of an electrical connection in the circuit, each one of said nodes also having a corresponding node signal value representative of a signal at that node at a given point in time, said system comprising:
 storing means for storing a plurality of events in an event queue, where each of said events comprises information about a selected node, information about each component connected to said selected node, and information about a scheduled time for said event to occur;
 retrieving means for retrieving from said event queue a first event;
 placing means for placing an event record of said first event in an event record storage, where each of said event records comprises an event time, the node associated with the event, and the node signal value of said associated node at a time before said event time;
 means for executing said first event;
 means for updating a node signal value storage to reflect execution of said first event;
 means for scheduling a new event; and
 means for recording said new event in the event queue.

11. The system of claim 10 wherein said storing means comprises means for placing in the event queue with each of said plurality of events the time each of said events was recorded to the event queue.

12. The system of claim 11, further comprising:
 means for suspending simulation of the circuit;
 means for accessing the information in said event record storage;
 means for modifying a signal value in the circuit;
 means for modifying said event queue; and
 means for reactivating simulation of the circuit.

13. The system of claim 10 further comprising means for storing said event information in a first memory stack.

14. The system of claim 13 wherein said first memory stack stores information for events occurring before a current time, and further comprising means for storing said event information for events occurring after a current time in a second memory stack.

15. The system of claim 10 further comprising:
 means for storing said event information for events occurring before a current time in a plurality of backward memory stacks; and
 means for storing said event information for events occurring after a current time in a plurality of forward memory stacks.

16. The system of claim 10, further comprising:
 means for suspending simulation of the circuit;
 means for accessing the information in said event record storage; and
 means for reactivating simulation of the circuit.

17. A system for activating and recording an event-driven simulation of the operation of a circuit, wherein the circuit is represented by a plurality of components connected by a plurality of nodes, each one of said nodes representative of an electrical connection in the circuit, each one of said nodes also having a corresponding node signal value representative of a signal in the circuit at that node at a given point in time, said system comprising:

means for retrieving an event from an event queue;

means for recording in a simulation record an event time, a node, and a signal value at said node corresponding to said event, said recording occurring before said event time;

means for updating a node value storage;

means for scheduling a new event;

means for recording said new event in the event queue.

18. The method of claim 17, further comprising:

means for suspending simulation of the circuit;

means for accessing the information in said simulation record; and means for reactivating simulation of the circuit.

* * * * *